United States Patent
Takigawa et al.

(10) Patent No.: US 7,211,519 B2
(45) Date of Patent: May 1, 2007

(54) METHOD FOR MANUFACTURING SEMICONDUCTOR DEVICE

(75) Inventors: Yukio Takigawa, Kawasaki (JP); Noriyoshi Shimizu, Kawasaki (JP); Toshiya Suzuki, Kawasaki (JP); Hajime Kawabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 205 days.

(21) Appl. No.: 11/094,578

(22) Filed: Mar. 31, 2005

(65) Prior Publication Data

US 2005/0191852 A1 Sep. 1, 2005

Related U.S. Application Data

(63) Continuation of application No. PCT/JP03/05506, filed on Apr. 30, 2003.

(51) Int. Cl.
*H01L 21/302* (2006.01)
*H01L 21/461* (2006.01)
*H01L 21/4763* (2006.01)

(52) U.S. Cl. .................. 438/736; 438/637; 438/638; 438/712; 438/724; 257/E21.576; 257/E21.579

(58) Field of Classification Search ............... 438/736; 257/E21.579
See application file for complete search history.

(56) References Cited

U.S. PATENT DOCUMENTS 6,162,583 A * 12/2000 Yang et al. ................. 430/313
6,383,907 B1   5/2002 Hasegawa et al.
6,479,380 B2 * 11/2002 Furusawa et al. ........... 438/638
6,593,246 B1 *  7/2003 Hasegawa et al. .......... 438/736
6,864,152 B1 *  3/2005 Mirbedini et al. ........... 438/427
7,122,900 B2 * 10/2006 Takeda et al. .............. 257/758
2002/0009873 A1   1/2002 Usami
2002/0173160 A1 * 11/2002 Keil et al. ................... 438/717
2003/0119307 A1 *  6/2003 Bekiaris et al. ............. 438/638
2006/0166482 A1 *  7/2006 Kanamura .................. 438/623

FOREIGN PATENT DOCUMENTS

| JP | 6-314679   | 11/1994 |
| JP | 2000-269192 | 9/2000  |
| JP | 2001-237168 | 8/2001  |
| JP | 2003-197738 | 7/2003  |

OTHER PUBLICATIONS

Patent Abstracts of Japan, Publication No. 2001044167 A, published on Feb. 16, 2001.
Patent Abstracts of Japan, Publication No. 03068141 A, published on Mar. 25, 1991.

* cited by examiner

*Primary Examiner*—B. William Baumeister
*Assistant Examiner*—Igwe U. Anya
(74) *Attorney, Agent, or Firm*—Westerman, Hattori, Daniels & Adrian, LLP.

(57) ABSTRACT

After an SiC film (4), an $SiO_2$ film (5) and a silicon nitride film (6) are formed sequentially on an organic low dielectric constant film (3), by performing $O_2$ plasma processing to a surface of the silicon nitride film (6), an oxide layer (7) is formed on the surface of the silicon nitride film (6). Then, a wiring trench pattern is formed on the silicon nitride film (6) and the oxide layer (7), and a resin layer (10) on which a via hole pattern is formed is formed. Subsequently, a portion of the oxide layer (7) exposed from the resin layer (10) is removed along with unnecessary particles.

16 Claims, 10 Drawing Sheets

METHOD FOR MANUFACTURING SEMICONDUCTOR DEVICE

This application is a continuation of international application PCT/JP03/05506 filed on Apr. 30, 2003.

TECHNICAL FIELD

The present invention relates to a method for manufacturing a semiconductor device suitable for a dual damascene method.

BACKGROUND ART

With the recent progress of highly integrated design of a semiconductor integrated circuit, density of a wiring pattern has increased, and a wiring has become longer. Al was conventionally used for a wiring material; however, wiring delay has come up as a problem with the miniaturization of the wiring pattern. Recently, Cu is mainly used as a wiring material in order to solve the problem. However, it is difficult to transfer a wiring pattern on Cu itself unlike Al. Therefore, when a Cu wiring is formed, a damascene method for transferring a wiring trench pattern on an interlayer insulating film and for forming the wiring pattern thereon by embedding Cu is effective. Furthermore, the damascene method is classified into a single damascene method for separately forming Cu in a trench and Cu in a via, and a dual damascene method for simultaneously forming a trench and a via.

However, in a conventional damascene method, either of a single damascene method and a dual damascene method, sometimes sufficient yield is not obtained under the influence of particles generated in the process.

Patent Document 1
Japanese Patent Application Laid-open No. Hei 6-3 14679
Patent Document 2
Japanese Patent Application Laid-open No. 2001-44 167
Patent Document 3
Japanese Patent Application Laid-open No. Hei 3-6 8141

SUMMARY OF THE INVENTION

It is an object of the present invention to provide a method for manufacturing a semiconductor device which makes it possible to improve a patterning of a film to be processed and obtain a high yield.

Here, faults in the case of forming a silicon nitride film 102 on an interlayer insulating film 101 such as an organic low dielectric constant film, and forming an opening in an area 104 of the interlayer insulating film 101 with the silicon nitride film 102 as a mask, as shown in FIG. 4A, will be explained. In manufacturing a semiconductor device, under present circumstances, when a film is formed or etched, it cannot be avoided that particles ride on a film formed on a semiconductor substrate. Especially, when a silicon nitride film is formed by a plasma CVD method, as shown in FIG. 4A, particle 103 tends to ride on the silicon nitride film 102.

In this state, when the silicon nitride film 102 is patterned with using a resist mask, particle 103 is not removed under the condition for etching the silicon nitride film 102, therefore, the particle 103 and the silicon nitride film 102 remain on the area 104 in which an opening is to be formed, as shown in FIG. 4B.

For this reason, even if the interlayer insulating film 101 is etched with the silicon nitride film 102 as a hard mask, the interlayer insulating film 101 remains in the area 104, as shown in FIG. 4C.

Consequently, sufficient yield is not obtained.

In a first method for manufacturing a semiconductor device according to the present invention, after forming a first mask film on a film to be processed, an oxide covering the first mask film is formed. A second mask film is formed on the oxide. A pattern is formed on the second mask film. Thereafter, a portion of the oxide exposed from the second mask film is removed. Subsequently, an opening is formed in the first mask film by patterning the first mask film with using the second mask film as a mask. The film to be processed is patterned in a state where the first mask film remains.

A second method for manufacturing a semiconductor device according to the present invention relates to a method of manufacturing a semiconductor device having a step of forming a wiring by a dual damascene method. According to the manufacturing method, after forming an interlayer insulating film on a conductive layer, a first hard mask is formed on the interlayer insulating film. A second hard mask is formed on the first hard mask. A third hard mask is formed on the second hard mask. Then, an oxide covering the third hard mask is formed. The oxide and the third hard mask are patterned with using a first resist mask on which a wiring trench pattern is formed. The first resist mask is removed. Then, a resin film is formed over an entire surface. Thereafter, the resin film is patterned with using a second resist mask on which a via hole pattern is formed. Subsequently, a portion of the oxide exposed from the resin film is removed. Then, the third hard mask, the second hard mask and the first hard mask are patterned with using the resin film as a mask. Next, a hole shallower than a thickness of the interlayer insulating film is formed in the interlayer insulating film by patterning the interlayer insulating film with using the second hard mask. Then, the second hard mask is patterned with using the third hard mask. Subsequently, the first hard mask is patterned with using the second hard mask. Thereafter, by patterning the interlayer insulating film with using second hard mask, the hole is made to reach a lower layer and thereby a via hole is formed, and simultaneously a wiring trench is formed in the interlayer insulating film. Then, wiring material is embedded in the via hole and the wiring trench.

Generally, the chemical characteristic of particles which comes flying on a semiconductor substrate while processing of a semiconductor device is similar to the characteristic of a silicon oxide. In the present invention, an oxide is formed so as to cover the film which has the problem of existence of such particles, and then, the oxide is removed. As a result, the particles are removed along with the oxide, and a film to be processed is patterned satisfactorily.

DETAILED DESCRIPTION OF THE PREFERRED EMBODIMENTS

A method for manufacturing a semiconductor device according to each of embodiments of the present invention will be concretely described below with reference to the attached drawings.

(First Embodiment)

Figure 1A:
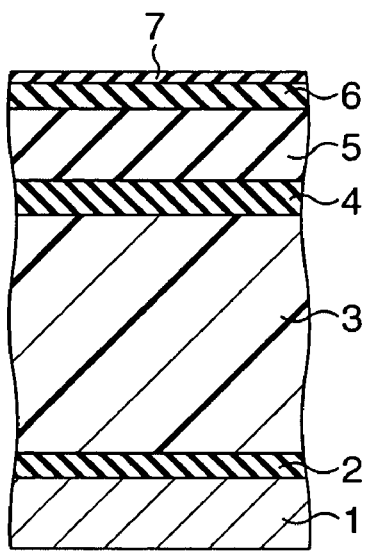
FIG. 1A to FIG. 1Q are sectional views sequentially showing process steps of a method for manufacturing a semiconductor device according to a first embodiment of the present invention.

First, a first embodiment of the present invention is explained. FIG. 1A to FIG. 1Q are sectional views sequentially showing process steps of a method for manufacturing a semiconductor device according to a first embodiment of the present invention. In the embodiment, a semiconductor device is manufactured by a trench-first hard mask dual damascene method. Here, in the trench-first hard mask method, a hard mask pattern for forming a wiring trench pattern is formed on an interlayer insulating film in advance, then a via is patterned directly on a level difference of the wiring trench pattern, and then a via is processed and a trench is processed in the interlayer insulating film in this order, thereby a dual damascene structure is formed.

As shown in FIG. 1A, an SiC film 2 as an etching stopper film is first formed on a Cu wiring 1. The SiC film 2 is, for example, 30 nm thick. Then, an organic low dielectric constant film 3 is formed on the SiC film 2 as an interlayer insulating film. The organic low dielectric constant film 3 is, for example, 450 nm thick. For example, SiLK (registered trademark) made by the Dow Chemical Company, FLEA (trademark or registered trademark) made by the ASM International, an organic SOG, amorphous carbon fluoride, and poly-tetra-fluoroethylene (Teflon of DuPont Company (registered trademark) and the like) may be used as ingredients of the organic low dielectric constant film 3.

A SiC film 4 is formed as a first hard mask on the organic low dielectric constant film 3, and further, an $SiO_2$ film 5 is formed as a second hard mask (a film to be processed). The SiC film 4 and the $SiO_2$ film 5 are, for example, 50 nm and 100 nm thick, respectively. Then, a silicon nitride film 6 is formed as a third hard mask (a first mask film) on the $SiO_2$ film 5, for example, by a plasma CVD method. The silicon nitride film 6 is a film to be etched when a hard mask pattern of a wiring trench is formed. The silicon nitride film 6 is, for example, 50 nm thick. Then, by performing $O_2$ plasma processing to the surface of the silicon nitride film 6, a silicon oxide film (an oxide layer) 7 is formed on the surface of the silicon nitride film 6. The oxide layer 7 is thinner than the $SiO_2$ film 5 and is about 0.1 nm to 10 nm thick, for example.

Figure 1B:
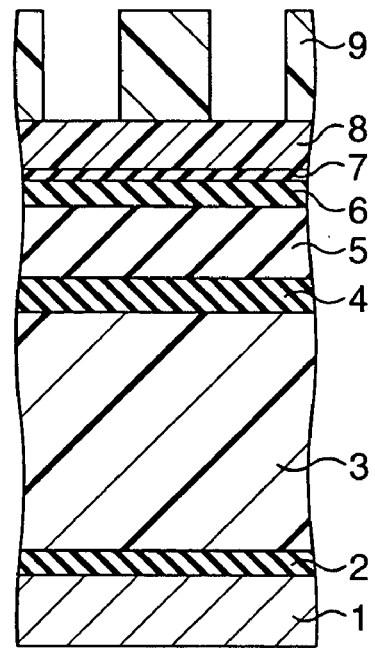

Then, as shown in FIG. 1B, an organic BARC (Bottom anti-reflection coating) 8 is formed as an anti-reflection film required for patterning on the oxide layer 7. The organic BARC 8 is, for example, 87 nm thick. A resist mask 9 on which a wiring trench pattern is formed is formed on the organic BARC 8, by applying an organic photoresist thereon, exposing and developing it. The resist mask 9 is, for example, 300 nm thick.

Note that, materials of the first to the third hard mask are not particularly limited, and following inorganic materials can be used: silicon nitride, silicon dioxide, silicon carbide, amorphous hydrogenated silicon carbide, silicon carbide nitride, organ-silicate glass, silicon rich oxide, tetra-ethyl-ortho-silicate, phosphor-silicate, organic siloxane polymer, carbon doped silicate glass, hydrogen doped silicate glass, silsesquioxane glass, spin-on glass, fluorinated silicate glass, and the like.

Figure 1C:
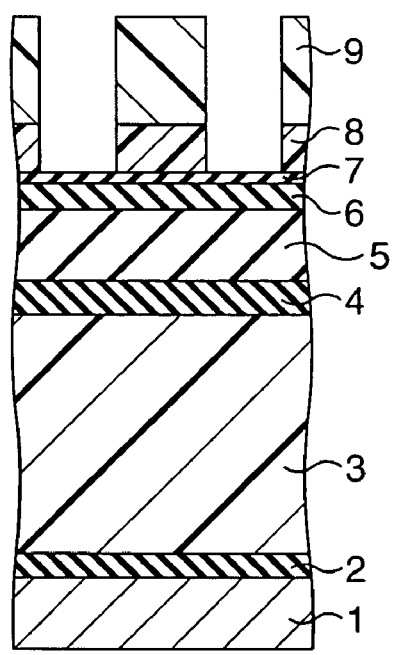

Next, as shown in FIG. 1C, the organic BARC 8 is etched by using the resist mask 9 as a mask. The etching is carried out by using a plasma etching apparatus under the following conditions: for example, $CF_4$: 0–200 sccm, Ar: 0–1000 sccm, $O_2$: 0–100 sccm, pressure: 0.13–40 Pa (1–300 mTorr), RF power: 100–1000 W, magnetic field: 0–10 mT (0–100 G).

Figure 1D:
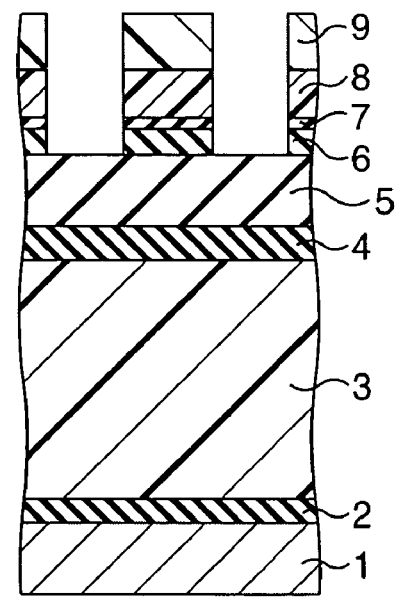

Then, as shown in FIG. 1D, the oxide layer 7 and the silicon nitride film 6 are etched by using the resist mask 9 and the organic BARC 8 as a mask. This etching is carried out by using a plasma etching apparatus under the following conditions: $CF_4$: 0–200 sccm, Ar: 0–1000 sccm, $O_2$: 0–100 sccm, pressure: 0.13–40 Pa (1–300 mTorr), RF power: 100–1000 W, magnetic field: 0–10 mT (0–100 G). Consequently, the oxide layer 7 and the silicon nitride film 6 are patterned to be wiring trench patterns.

Figure 1E:
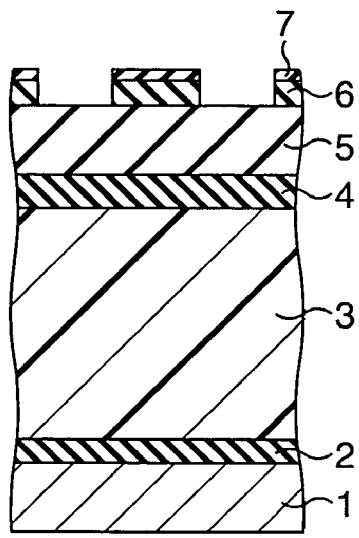

Then, as shown in FIG. 1E, the resist mask 9 and the organic BARC 8 are removed by ashing. The ashing is carried out by using a plasma ashing apparatus under the following conditions: for example, $O_2$: 0–100 sccm, pressure: 0.13–67 Pa (1–500 mTorr), RF power: 100–1000 W. As a result, particles are accumulated on the $SiO_2$ film 5 and the oxide layer 7. The particles are considered to have adhered to the inner wall of a film forming chamber, and its chemical characteristic resembles that of silicon oxide.

Next, a via hole pattern is formed on the organic low dielectric constant film 3 or the like which is the interlayer insulating film. Here, a tri-level technology is adopted for the wiring trench pattern formed on the silicon nitride film 6.

Figure 1F:
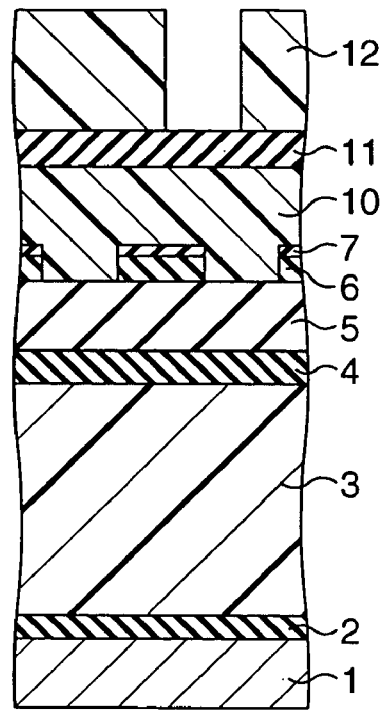

Specifically, first, as shown in FIG. 1F, a bottom resin film (a second mask film) 10 which fills and flattens level differences on the silicon nitride film 6 is formed. The bottom resin film 10 is thinner than the organic low dielectric constant film 3, and for example, between 70 nm and 400 nm thick, 300 nm thick in the embodiment, when the organic low dielectric constant film 3 is between 100 nm and 600 nm thick. Next, an SOG (spin-on glass) film 11 used as a mask when the bottom resin film 10 is etched is formed on the bottom resin film 10. A thickness of the SOG film 11 is thinner than a total film thickness of the SiC film 4, the $SiO_2$ film 5, and the silicon nitride film 6, and, for example, between 30 nm and 200 nm thick, 86 nm thick in the embodiment. A resist mask (a photoresist film) 12 on which a via hole pattern is formed is formed on the SOG film 11, by applying an organic photoresist thereon, exposing and developing it. A thickness of the resist mask 12 is approximately equal with that of the bottom resin film 10, and, for example, between 70 nm and 400 nm thick, 300 nm thick in the embodiment.

Incidentally, as the photoresist, for example, a material exposed by a KrF laser (wavelength: 248 nm), a material exposed by an ArF laser (wavelength: 193 nm), a material exposed by an F2 laser (wavelength: 157 nm), a material exposed by an electron beam, and the like may be used.

Furthermore, for example, SOG materials such as organ-silicate glass, organic siloxane polymer, and the like can be used as ingredients of the SOG film 11, and, for example, an applied-type organic resin material can be used as an ingredient of the bottom resin film 10.

Figure 1G:
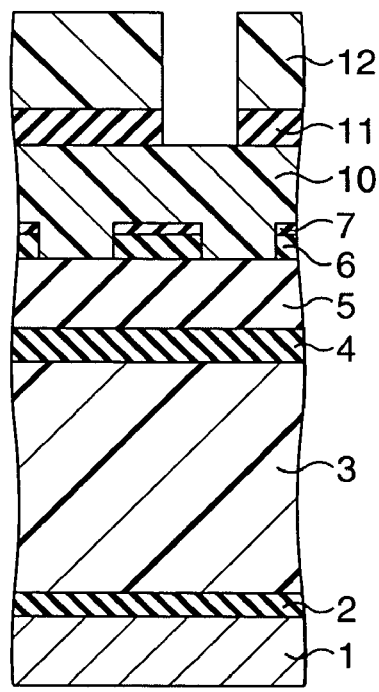

Next, as shown in FIG. 1G, the SOG film 11 is etched by using the resist mask 12 as a mask. The etching is carried out by using a plasma etching apparatus under the following conditions: for example, $CF_4$: 0–200 sccm, Ar: 0–1000 sccm, $O_2$: 0–100 sccm, pressure: 0.13–40 Pa (1–300 mTorr), RF power: 100–1000 W, magnetic field: 0–10 mT (0–100 G).

Figure 1H:
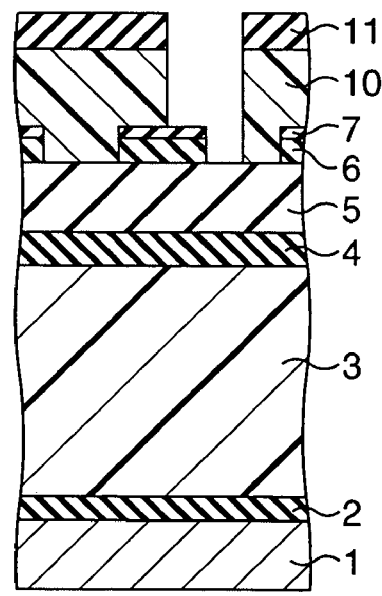

Subsequently, as shown in FIG. 1H, the bottom resin film 10 is etched by using the SOG film 11 as a mask, and at the same time, the resist mask 12 is removed. The etching is carried out by using a plasma etching apparatus under the following conditions: for example, $NH_3$: 1–500 sccm, pressure: 0.13–40 Pa (1–300 mTorr), RF power: 100–1000 W, magnetic field: 0–10 mT (0–100 G). Etching selectivity between the bottom resin film 10 and the resist mask 12 is approximately 1 in the etching because the bottom resin film 10 is organic as well as the resist mask 12. Therefore, if a film thickness of the resist mask 12 is extremely thicker than that of the bottom resin film 10, the resist mask 12 may remain on the SOG film 11 when the etching of the bottom resin film 10 is completed. Therefore, the film thickness of the resist mask 12 is preferably equal with or below that of the bottom resin film 10. As a result of the etching, particles are accumulated again on the $SiO_2$ film 5 and the oxide layer 7.

Figure 1I:
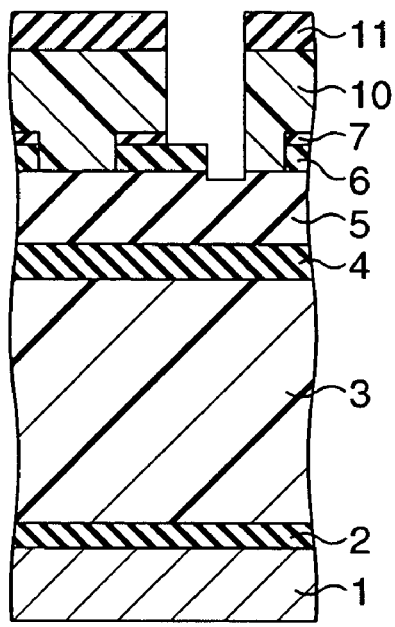

Thereafter, as shown in FIG. 1I, by removing a portion of the oxide layer 7 exposed from the SOG film 11 and by removing a surface layer part of the $SiO_2$ film 5, the particles accumulated on the $SiO_2$ film 5 and the oxide layer 7 are removed. Although any of hydrofluoric acid, diluted hydrofluoric acid, ammonia-hydrogen peroxide, ammonium fluoride, phosphoric acid, ammonium phosphate, ammonium acetate and the like can be used for the removal of particles, hydrofluoric acid is the most preferable. Furthermore, after the removal of particles, it is preferable to clean by spraying deionized water.

Figure 1J:
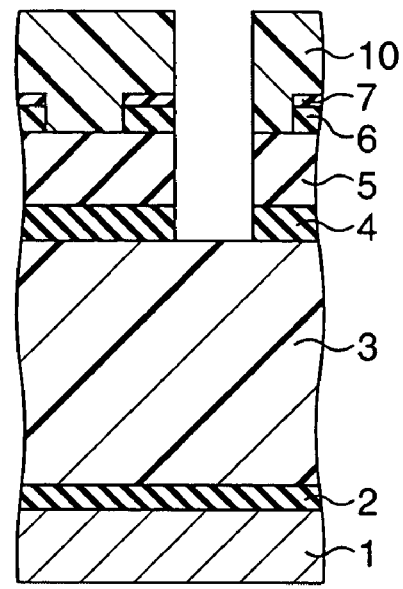

Subsequently, as shown in FIG. 1J, by etching the silicon nitride film 6, $SiO_2$ film 5, and the SiC film 4 (a triple layer hard mask) by using the bottom resin film 10 as a mask, a via hole pattern is formed on these films, and the SOG film 11 is simultaneously removed. The etching is carried out by using a plasma etching apparatus under the following conditions: for example, $CF_4$: 0–200 sccm, Ar: 0–1000 sccm, $O_2$: 0–100 sccm, pressure: 0.13–40 Pa (1–300 mTorr), RF power: 100–1000 W, magnetic field: 0–10 mT (0–100 G). The SOG film 11 is simultaneously removed during the etching by adopting a condition that etching selectivity between the SOG film 11 and the triple layer hard mask is approximately 1. Therefore, if a film thickness of the SOG film 11 is extremely thicker than the total film thickness of the triple layer hard mask, the SOG film 11 may remain when etching of the triple layer hard mask is completed. Accordingly, the film thickness of the SOG film 11 is preferably equal with or below the total film thickness of the silicon nitride film 6, the $SiO_2$ film 5, and the SiC film 4.

Figure 1K:
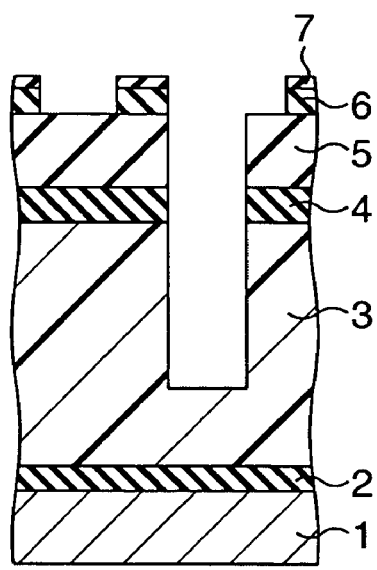

Thereafter, as shown in FIG. 1K, the organic low dielectric constant film 3 is etched to the extent of 200 nm to 400 nm by using the triple layer hard mask as a mask, and at the same time, the bottom resin film 10 is removed. The etching is carried out by using a plasma etching apparatus under the following conditions: for example, $NH_3$: 1–500 sccm, pressure: 0.13–40 Pa (1–300 mTorr), RF power: 100–1000 W, magnetic field: 0–10 mT (0–100 G). A hole formed in the organic low dielectric constant film 3 by the etching is a part of a via hole.

Figure 1L:
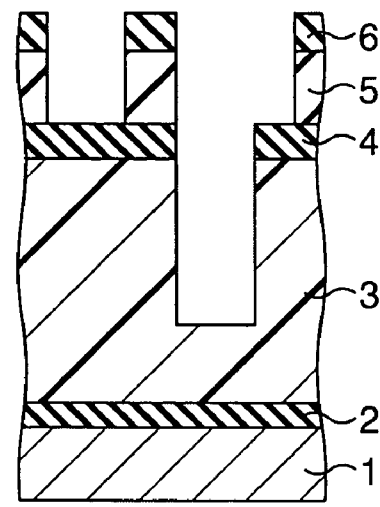

Then, the $SiO_2$ film 5 is etched by using the silicon nitride film 6 exposed by removal of the bottom resin film 10 as a mask. Consequently, as shown in FIG. 1L, the wiring trench pattern is also formed on the $SiO_2$ film 5, and the oxide layer 7 is removed. The etching is carried out by using a plasma etching apparatus under the following conditions: for example, $C_4F_6$: 1–100 sccm, Ar: 1–500 sccm, $O_2$: 1–100 sccm, pressure: 0.13–40 Pa (1–300 mTorr), RF power: 100–2000 W, magnetic field: 0–10 mT (0–100 G).

Figure 1M:
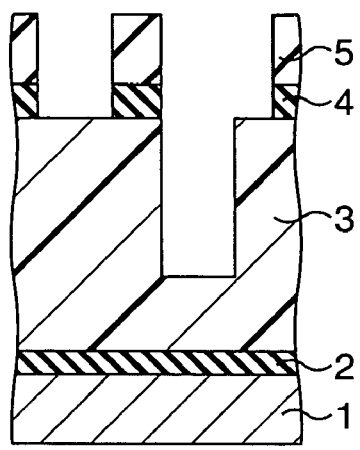

Next, the SiC film 4 is etched by using the silicon nitride film 6 and the $SiO_2$ film 5 as a mask. As a result, as shown in FIG. 1M, the wiring trench pattern is also formed on the SiC film 4, and at the same time, the silicon nitride film 6 is removed. The etching is carried out by using a plasma etching apparatus under the following conditions: for example, $CHF_3$: 0–100 sccm, $CH_2F_2$: 0–100 sccm, $N_2$: 1–500 sccm, $O_2$: 1–100 sccm, pressure: 0.13–40 Pa (1–300 mTorr), RF power: 100–2000 W, magnetic field: 0–10 mT (0–100 G).

Figure 1N:
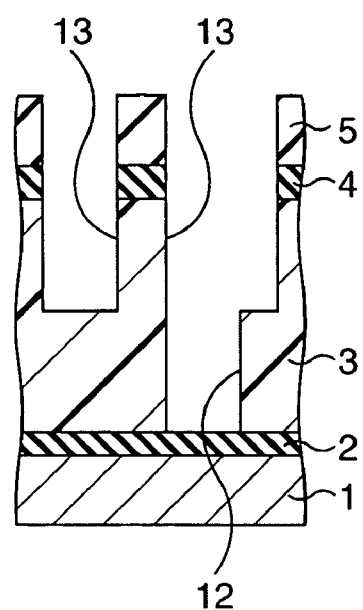

Then, the organic low dielectric constant film 3 which is the interlayer insulating film is etched by using the $SiO_2$ film 5 and the SiC film 4 as a mask, consequently, as shown in FIG. 1N, a wiring trench 13 whose depth is approximately 200 nm is formed, and at the same time, a via hole 12 which reaches the SiC film 2 is formed. The etching is carried out by using a plasma etching apparatus under the following conditions: for example, $NH_3$: 1–500 sccm, $H_2$: 0–500 sccm, Ar: 0–500 sccm, pressure: 0.13–133 Pa (1–1000 mTorr), RF power: 100–1000 W, magnetic field: 0–10 mT (0–100 G).

Note that, in the process, since depth of the wiring trench is to be approximately 200 nm, if the depth of the hole is too shallow during the process shown in FIG. 1K, for example, 250 nm or below, there is a possibility that the via hole 12 may not reach the SiC film 2 during the process.

Figure 1O:
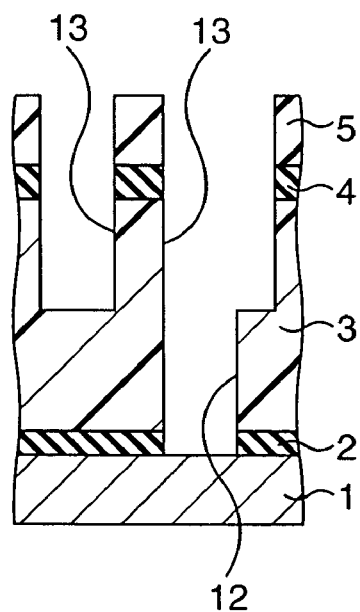

Then, the SiC film 2 is etched by using the $SiO_2$ film 5, the SiC film 4, and the organic low dielectric constant film 3 as a mask; consequently, the via hole 12 is made to reach the Cu wiring, as shown in FIG. 1O. As a result, a structure of the dual damascene is completed. The etching is carried out by using a plasma etching apparatus under the following conditions: for example, $CHF_3$: 0–100 sccm, $CH_2F_2$: 0–100 sccm, $N_2$: 1–500 sccm, $O_2$: 1–100 sccm, pressure: 1–300 mTorr, RF power: 100–2000 W, magnetic field: 0–100 G.

Figure 1P:
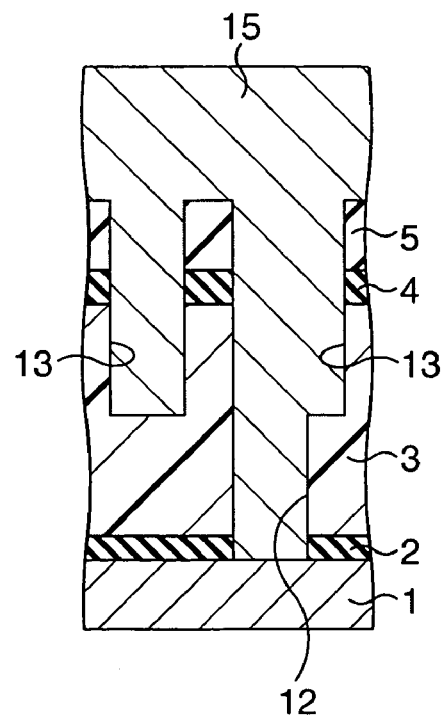
Figure 1Q:
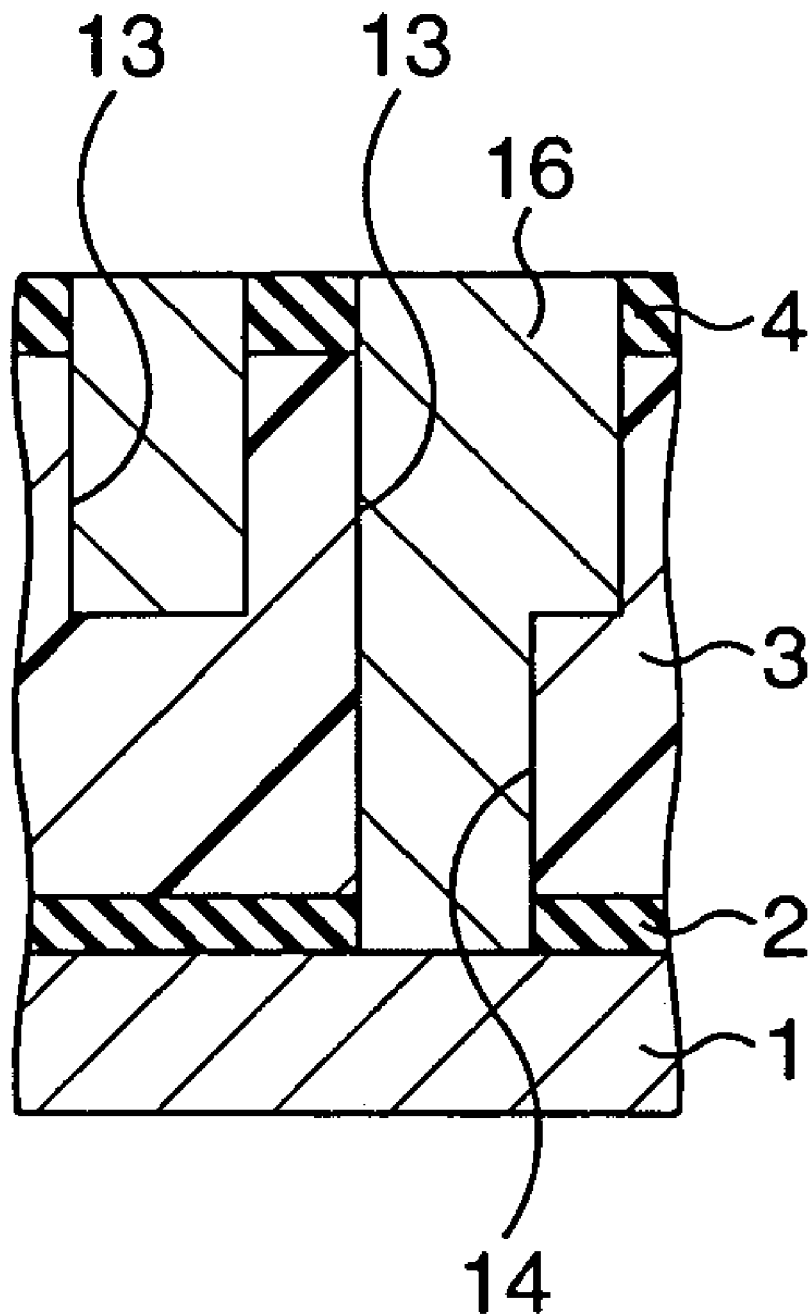

Subsequently, after a barrier metal (not shown) is formed in the via hole 12 and the wiring trench 13, Cu 15 is embedded in the via hole 13 and the wiring trench 12 as shown in FIG. 1P, and then a Cu wiring 16 is formed by processing the Cu 15 by CMP as shown in FIG. 1Q. The semiconductor device is completed by forming other interlayer insulating films, wirings, and the like as necessary.

Figure 2:
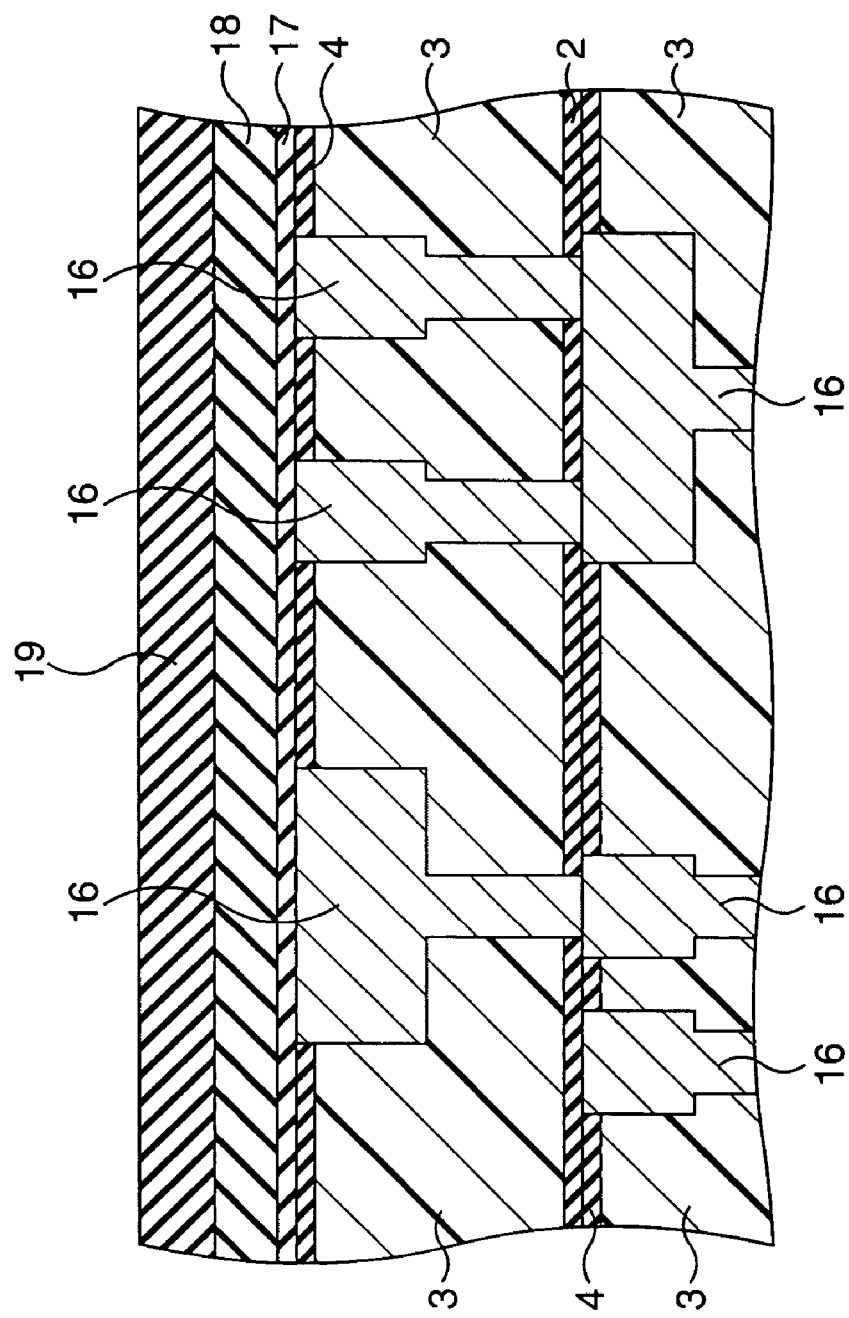
FIG. 2 is a sectional view showing the structure of the semiconductor device manufactured by applying the first embodiment thereto.

FIG. 2 is a sectional view showing the structure of the semiconductor device manufactured by applying the present embodiment thereto. In the example shown in FIG. 2, at least double layer multilayered wirings are formed according to the manufacturing method relating to the aforementioned embodiment. A passivation layer 17 made of silicon nitride or the like is formed on the Cu wirings 16 and the organic low dielectric constant film 3 which compose the uppermost layer. Furthermore, a cover film composed of an SiO film 18 and an silicon nitride film 19 is formed on the passivation layer 17. An opening (not shown) for taking out a pad is formed in the cover film as necessary.

According to the first embodiment, since the oxide layer 7 covering the silicon nitride film 6 used as a part of hard mask is formed, the particles, which has come flying toward the silicon nitride film 6 in the process between exposing the oxide layer 7 and removing the oxide layer 7, all ride on the oxide layer 7. Therefore, the particles are removed along with the removal of the oxide layer 7. Especially, in the case of a plasma CVD method, although particles may ride on the silicon nitride film 6 when the silicon nitride film 6 is formed, such particles are removed along with the removal of the oxide layer 7 because the chemical characteristic of the particles resembles that of a silicon oxide. Accordingly, immediately after removing the oxide layer 7, no particle exists on the silicon nitride film 6. Since the silicon nitride film 6 is etched in this state, a desired pattern is formed on the silicon nitride film 6. Consequently, an excellent patterning of the organic low dielectric constant film 3, which is an interlayer insulating film, is obtained.

In the first embodiment, although the trench-first hard mask method is adopted, the via-first hard mask method may be adopted.

Here, a result of an experiment conducted by the present inventors is explained. In this experiment, with using hydrofluoric acid and ammonia-hydrogen peroxide as processing solvent for removing particles, the number of the existing particles before and after processing is investigated about two types of wafer structure. The results are shown in Table 1. The number of the particle existing after processing indicates the number after cleaning by the deionized water. Moreover, the processing time is for 30 seconds, and cleaning time is also for 30 seconds. As shown in Table 1, in each sample, the number of the particles decreased sharply.

(Second Embodiment)

Next, the second embodiment of the present invention will be described. FIG. 3A to FIG. 3K are sectional views sequentially showing process steps of a method for manufacturing a semiconductor device according to a second embodiment of the present invention. In this embodiment, a semiconductor device is manufactured by a single damascene method.

Figure 3A:
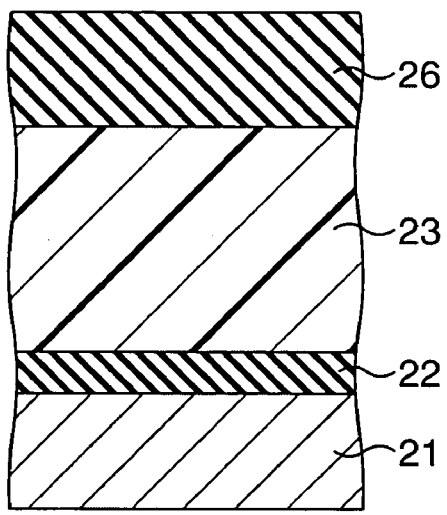
FIG. 3A to FIG. 3K are sectional views sequentially showing process steps of a method for manufacturing a semiconductor device according to a second embodiment of the present invention.

As shown in FIG. 3A, a SiC film 22 is first formed as an etching stopper film on a Cu wiring 21.

Next, an organic low dielectric constant film 23 is formed as an interlayer insulating film (a film to be processed) on the SiC film 22. Subsequently, a silicon nitride film 26 is formed as a hard mask (a first mask film) on the organic low dielectric constant film 23, for example, by a plasma CVD method.

Figure 3B:
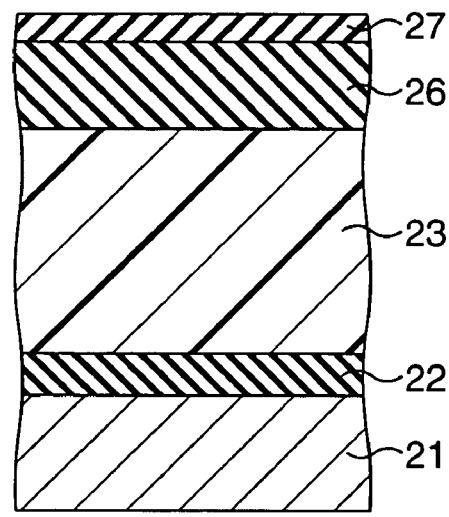
Figure 3C:
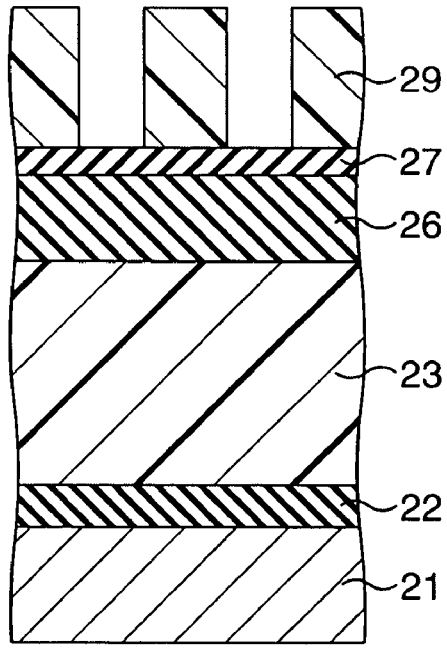

Thereafter, as shown in FIG. 3B, a silicon oxide film (an oxide layer) 27 is formed on the surface of the silicon nitride film 26 by performing $O_2$ plasma processing to a surface of the silicon nitride film 26. Then, as shown in FIG. 3C, a resist mask 29 on which a wiring trench pattern is formed is formed on the oxide layer 27, by applying an organic photoresist (a second hard mask) on the oxide layer 27, exposing and developing it. At this time, particles are accumulated on the oxide layer 27.

Figure 3D:
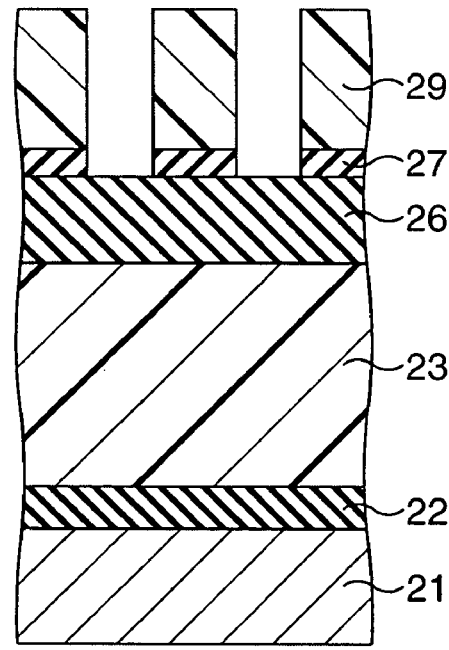
Figure 3E:
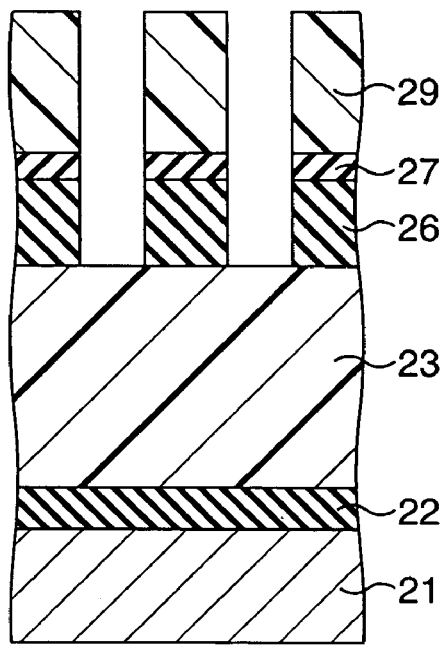

Next, as shown in FIG. 3D, by removing a portion of the oxide layer 27 exposed from the resist mask 29, the particles accumulated on the oxide layer 27 are removed. In the removal of particles, diluted hydrofluoric acid, ammonia-hydrogen peroxide and the like may be used. Then, as shown in FIG. 3E, the silicon nitride film 26 is etched by using the resist mask 29 as a mask.

Figure 3F:
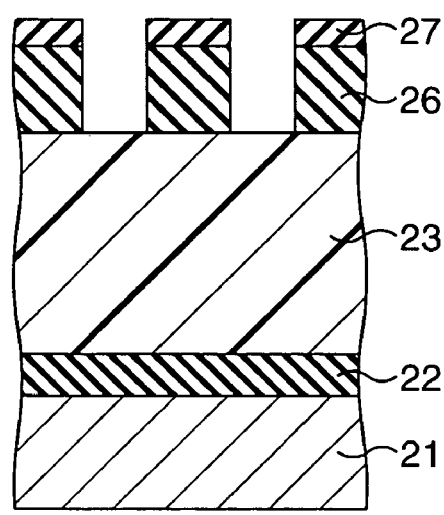
Figure 3G:
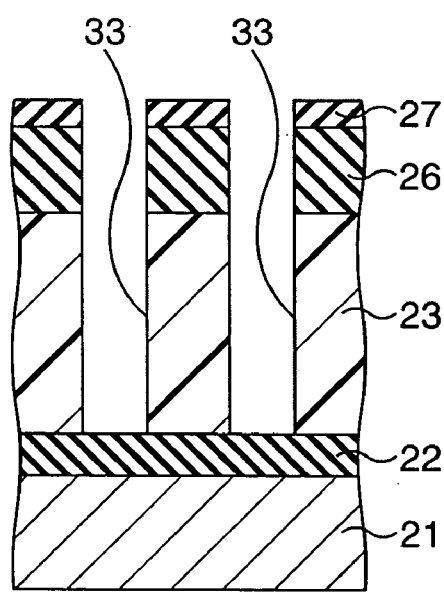

Thereafter, as shown in FIG. 3F, the resist mask 29 is removed. Then, as shown in FIG. 3G, the organic low dielectric constant film 23 is etched by using the oxide layer 27 and the silicon nitride film 26 as a mask. By the etching, a wiring trench 33 is formed in the organic low dielectric constant film 23.

Figure 3H:
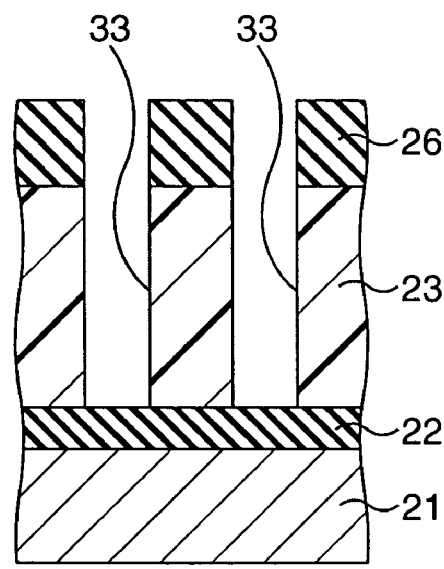
Figure 3I:
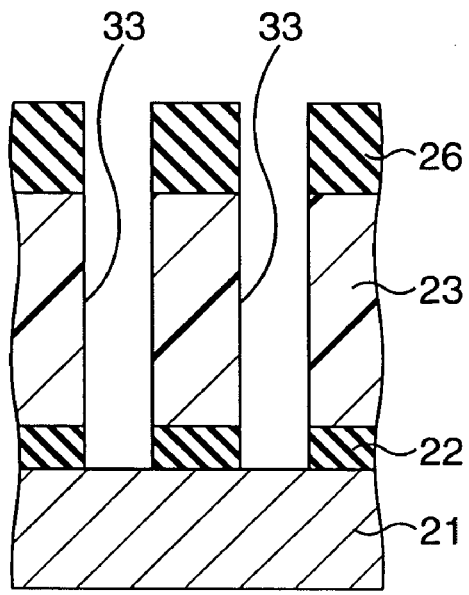

Next, as shown in FIG. 3H, the oxide layer 27 is removed. Subsequently, by etching the SiC film 22 by using the silicon nitride film 26 as a mask, the wiring trench 33 is made to reach the Cu wiring 31, as shown in FIG. 3I.

Figure 3J:
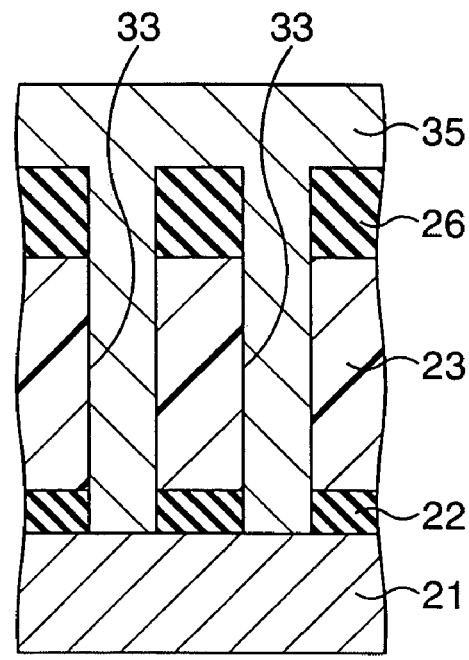
Figure 3K:
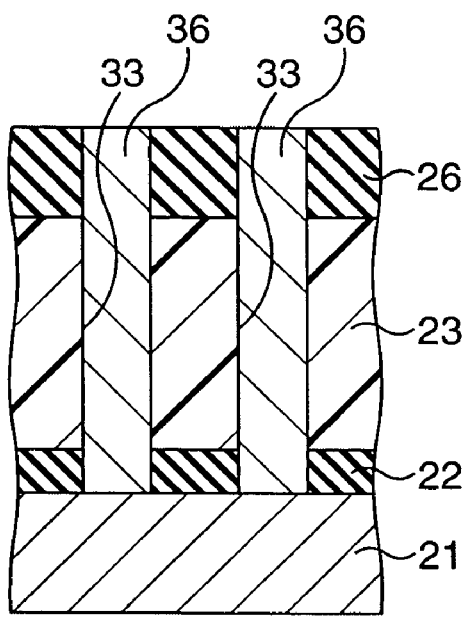
Figure 4A:
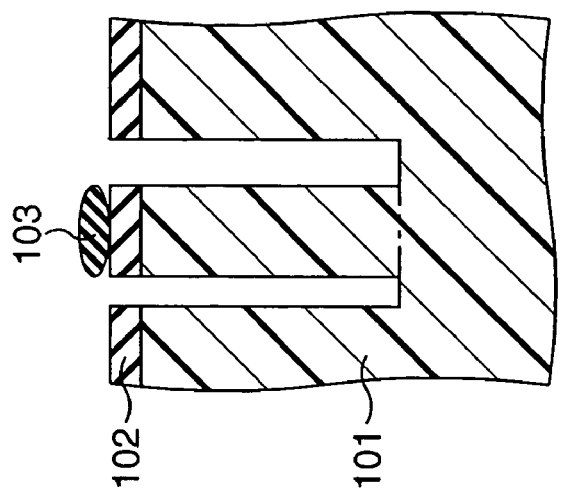
FIG. 4A to FIG. 4C are sectional views sequentially showing process steps of the conventional method for manufacturing a semiconductor device.
Figure 4B:
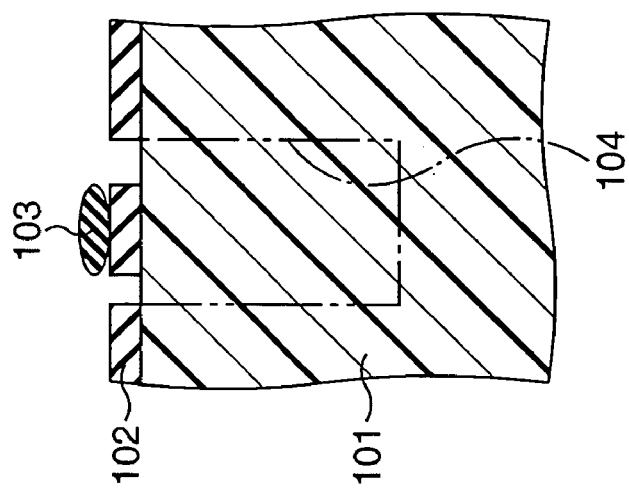
Figure 4C:
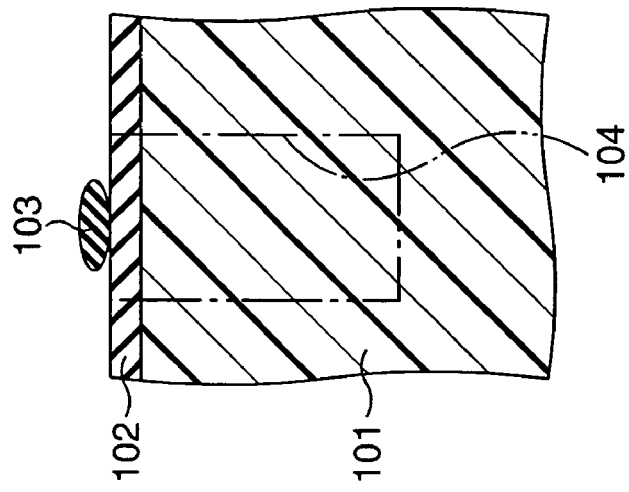

As shown in FIG. 3J, Cu 35 is embedded in the wiring trench 33, and the Cu wiring 36 is formed by processing the Cu 35 by CMP, as shown in FIG. 3K. The semiconductor device is completed by forming other interlayer insulating films, wirings, and the like as necessary.

According to the second embodiment, even if particles exist on the silicon nitride film 26, they are removed along with the oxide layer 27. Therefore, the organic low dielectric constant film 23 can be patterned excellently.

Note that, in either of the first and second embodiments, when the silicon oxide film (the oxide layer) is formed, not only plasma oxidization but also thermal oxidization may be performed, and a silicon oxide film covering the silicon nitride film may be formed, for example, by a CVD method.

Moreover, as a first mask film (a hard mask), other than a silicon nitride film, a silicon carbide (SiC) film, a silicon oxycarbide (SiOC) film, and fluorinated silicate glass (FSG) film, or the like may be used.

Furthermore, it is not necessary to use a low dielectric constant material as an interlayer insulating film. In addition, not only an organic interlayer dielectric but also an inorganic interlayer insulating film may be used.

INDUSTRIAL APPLICABILITY

As described above, according to the present invention, since films to be processed, such as an interlayer insulating film and a hard mask of a lower layer, can be certainly patterned to be a desired shape, the high yield can be obtained.

TABLE 1

| Sample No. | Wafer structure | Processing solvent | Before processing | After processing |
|---|---|---|---|---|
| 1 | A | Hydrofluoric acid | 913 | 160 |
| 2 | A | Ammonia-hydrogen peroxide | 875 | 524 |
| 3 | B | Hydrofluoric acid | 613 | 455 |

What is claimed is:

1. A method for manufacturing a semiconductor device comprising the steps of:
    forming a first mask film on a film to be processed;
    forming an oxide covering said first mask film;
    forming a second mask film on said oxide;
    forming a pattern on said second mask film;
    removing a portion of said oxide exposed from said second mask film;
    forming an opening in said first mask film by patterning said first mask film with using said second mask film as a mask; and
    patterning said film to be processed in the state where said first mask film remains.

2. The method according to claim 1, wherein, as said first mask film, one insulating film selected from the group consisting of a silicon nitride film, a silicon carbide film, a silicon oxycarbide film and a fluorinated silicate glass film is formed.

3. The method according to claim 1, wherein said step of forming the oxide includes the step of performing thermal oxidation of a surface of said first mask film.

4. The method according to claim 1, wherein said step of forming the oxide includes the step of performing $O_2$ plasma processing to a surface of said first mask film.

5. The method according to claim 1, wherein said first mask film is formed by a plasma CVD method.

6. The method according to claim 1, wherein said step of removing the portion of said oxide exposed from said second mask film includes the step of immersing the exposed portion in one solution selected from the group consisting of hydrofluoric acid, diluted hydrofluoric acid, ammonia-hydrogen peroxide, ammonium fluoride, phosphoric acid, ammonium phosphate and ammonium acetate.

7. The method according to claim 1, further comprising, after the step of removing the portion of said oxide exposed from said second mask film, the step of rinsing the portion of said first mask film exposed from said second mask film.

8. The method according to claim 7, wherein said step of rinsing the portion of said first mask film exposed from said second mask film includes the step of spraying deionized water on the portion of said first mask film exposed from said second mask film.

9. The method according to claim 1, further comprising, before the step of forming said second mask film, the step of processing said first mask film to be a shape for a wiring trench pattern in a dual damascene method.

10. The method according to claim 9, wherein, in said step of forming a pattern on said second mask film, a via hole pattern is formed.

11. The method according to claim 1, wherein an insulating film made of organic is used as said film to be processed.

12. The method according to claim 1, wherein a low dielectric constant insulating film is used as said film to be processed.

13. The method according to claim 1, wherein,
an interlayer insulating film is formed over a conductive layer as said processed film,
in the step of patterning said processed film, an opening is formed in said interlayer insulating film with said first mask film as a mask, and
the method comprises the step of embedding a wiring material in said opening.

14. The method according to claim 1, wherein,
the method further comprises the steps of, before the step of forming said first mask film, forming an interlayer insulating film over a conductive layer, and forming a first hard mask over said interlayer insulating film,
a second hard mask is formed as said film to be processed on said first hard mask,
a third hard mask is formed as said first mask film on said second hard mask,
the method further comprises the steps of, before the step of forming said second mask film, patterning said oxide and said third hard mask with using a first resist mask on which a wiring trench pattern is formed, and removing said first resist mask,
a resin film is formed as said second mask film over an entire surface, and
the method further comprises the steps of, after the step of patterning said film to be processed, patterning said third hard mask, forming an opening in said interlayer insulating film by patterning said interlayer insulating film with using said first to third hard masks, and embedding a wiring material in said opening.

15. A method for manufacturing a semiconductor device having the step of forming a wiring by a dual damascene method, comprising the steps of:
forming an interlayer insulating film on a conductive layer;
forming a first hard mask on said interlayer insulating film;
forming a second hard mask on said first hard mask;
forming a third hard mask on said second hard mask;
forming an oxide covering said third hard mask;
patterning said oxide and said third hard mask with using a first resist mask on which a wiring trench pattern is formed;
removing said first resist mask;
forming a resin film over an entire surface;
patterning said resin film with using a second resist mask on which a via hole pattern is formed;
removing a portion of said oxide exposed from said resin film;
patterning said third, second and first hard masks with using said resin film as a mask;
forming a hole shallower than a thickness of said interlayer insulating film in said interlayer insulating film by patterning said interlayer insulating film with using said second hard mask;
patterning said second hard mask with using said third hard mask;
patterning said first hard mask with using said second hard mask;
making said hole reach a lower layer and thereby forming a via hole, and simultaneously forming a wiring trench in said interlayer insulating film, by patterning said interlayer insulating film with using said second hard mask; and
embedding a wiring material in said via hole and said wiring trench.

16. The method according to claim 15, wherein one insulating film selected from the group consisting of a silicon nitride film, a silicon carbide film, a silicon oxycarbide film and a fluorinated silicate glass film is formed as said third mask film.

* * * * *